United States Patent [19]

Keyser et al.

[11] Patent Number: 4,489,482
[45] Date of Patent: Dec. 25, 1984

[54] IMPREGNATION OF ALUMINUM INTERCONNECTS WITH COPPER

[75] Inventors: Thomas Keyser, Mountain View; Michael E. Thomas, Cupertino; John M. Pierce, Palo Alto; James M. Cleeves, Redwood City, all of Calif.

[73] Assignee: Fairchild Camera & Instrument Corp., Mountain View, Calif.

[21] Appl. No.: 501,348

[22] Filed: Jun. 6, 1983

[51] Int. Cl.$^3$ .................... H01L 21/92; H01L 21/285
[52] U.S. Cl. ........................ 29/591; 357/67; 427/90
[58] Field of Search .................. 29/589–591; 357/67, 71; 427/90, 89

[56] References Cited

U.S. PATENT DOCUMENTS 3,725,309  4/1973  Ames et al. .................... 428/614
4,335,506  6/1982  Chiu et al. .................... 29/590 X

OTHER PUBLICATIONS

Colclaser, R. A., *Microelectronics: Processing and Device Design*, John Wiley & Sons, New York, 1980, pp. 44–48, 104–109.

*Primary Examiner*—Brian E. Hearn
*Assistant Examiner*—Alan E. Schiavelli
*Attorney, Agent, or Firm*—Townsend & Townsend

[57] ABSTRACT

A method for impregnating copper into aluminum interconnect lines on a semiconductor device is disclosed. In a first embodiment, an interconnect pattern is formed on an aluminum layer by etching while the aluminum is substantially free from copper, and the copper is thereafter introduced to the formed interconnect lines. In a second embodiment, copper is introduced to the aluminum layer prior to formation of the desired interconnect pattern. The copper-rich layer is removed from the areas to be etched prior to etching. The method facilitates chlorine plasma etching of the aluminum which is inhibited by the presence of copper. The method is also useful with various wet etching processes where the formation of a copper-rich layer is found to stabilize the aluminum layer during subsequent processing.

6 Claims, 17 Drawing Figures

IMPREGNATION OF ALUMINUM INTERCONNECTS WITH COPPER

BACKGROUND OF THE INVENTION

1. Field of the Invention

The present invention relates generally to the manufacture of semiconductor devices, and more particularly to a method for impregnating aluminum conductors or interconnections on such devices with copper to inhibit electromigration.

2. Description of the Prior Art

Aluminum conductors or interconnects formed on semiconductor devices suffer from electromigration caused by high current flow through the conductor. In the most severe cases, the electromigration can result in complete deterioration of the conductor and a break in the connection. Such electromigration can be lessened, however, by alloying the aluminum with a small amount of copper, typically from 0.5 to several weight percent. Heretofore, this aluminum-copper alloy has usually been deposited from single or dual evaporation sources, or by sputtering.

Unfortunately, the copper in the aluminum-copper alloys render the alloy resistant to chlorine plasma etching. The copper chlorides which are formed during the etching process inhibit further etching. Moreover, after the etching is completed, some copper chlorides will remain. Since copper chlorides are hydroscopic, they will absorb water when exposed to the atmosphere and form hydrochloric acid which will corrode the adjacent aluminum.

For these reasons, it would be desirable to provide a method for forming aluminum-copper interconnects, which method avoids the necessity of plasma etching aluminum-copper alloys and which does not leave residual copper chloride to corrode the aluminum.

SUMMARY OF THE INVENTION

The present invention overcomes the problems associated with copper chloride formation by introducing copper only to that portion of the aluminum layer which eventually comprises the interconnect lines. Thus, the remaining portion of the aluminum layer which is removed by chlorine plasma etching remains free from copper and the formation of copper chlorides.

In the preferred embodiment, copper is not introduced into the aluminum until after the interconnect lines have been formed by plasma etching. After etching, a uniform layer of copper is deposited over the entire surface of the device, typically by sputtering. The copper is then diffused into the aluminum at elevated temperature. After sufficient copper has been introduced into the aluminum, the excess copper is removed using a liquid etchant.

In an alternate embodiment, the aluminum layer is deposited using standard techniques. A layer of copper is then deposited prior to forming the desired pattern of interconnect lines, and the copper diffused into the aluminum at elevated temperatures. The photoresist pattern is then applied directly on top of the copper-rich surface of the aluminum. After wet etching to remove the copper layer from the exposed areas, the photoresist is hard baked to flow a portion over the edges of the copper layer. The device is then plasma etched to remove the aluminum, which is substantially free from copper. The photoresist layer is stripped and the device is ready for further conventional processing. In both variations, the copper is further diffused into the aluminum layer during subsequent heating steps which will be encountered during standard processing.

In addition to the improved electromigration resistance, it has been found that aluminum layers impregnated with copper by the method of the present invention remain more stable during subsequent processing steps. In particular, it has been found that localization of the copper-rich layer near the upper surface of the aluminum inhibits dislocation of the aluminum layer which results in hillock formation and the like.

DESCRIPTION OF THE PREFERRED EMBODIMENTS

According to the present invention, semiconductor devices having aluminum conductors or interconnects are manufactured by introducing an aluminum layer substantially free from copper onto the semiconductor device and, thereafter, introducing a desired amount of copper into the aluminum. In this way, aluminum interconnects having copper to prevent electromigration can be formed without the necessity of plasma etching aluminum-copper alloys. Two specific methods for performing the present invention have been developed, and they will be described in order.

Figure 1A:
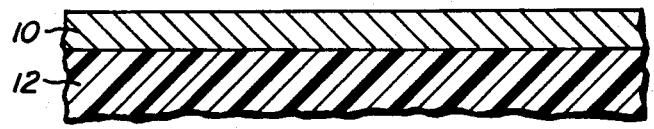
FIGS. 1A-1H illustrate the process steps in the first embodiment of the invention.
Figure 1B:
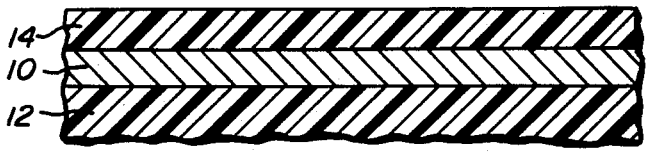
Figure 1C:
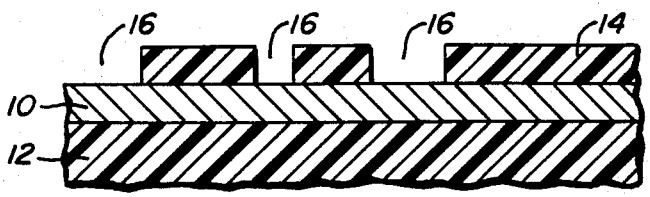
Figure 1D:
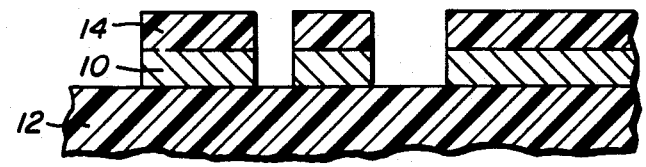
Figure 1E:
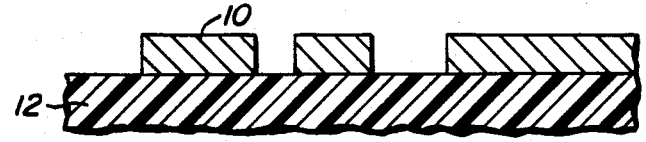
Figure 1F:
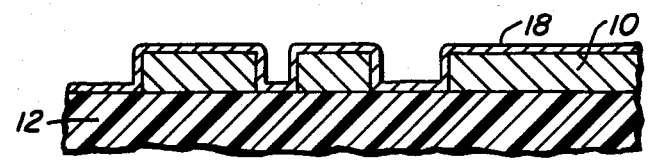
Figure 1G:
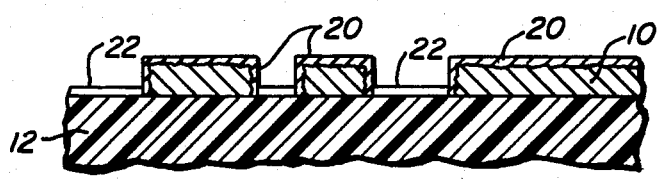

Referring to FIGS. 1A-1H, a method where the aluminum interconnect pattern is formed prior to the introduction of copper will be described first. The first step (FIG. 1A) involves the deposition of an aluminum layer 10 (typically an aluminum-silicon alloy) onto a wafer substrate 12. The substrate 12 may be a silicon wafer or may include a titanium-tungsten barrier layer (not illustrated) intermediate the silicon and the aluminum 10. Thereafter, a photoresist layer 14 (FIG. 1B) is applied on top of the aluminum and heated to dry the film layer. A desired pattern is imparted to the photoresist layer by exposure to light through a mask. The photoresist is then developed in selective solvents, forming a pattern of channels 16 in the photoresist 14 (FIG. 1C). After heating to further harden the photoresist, the aluminum layer 10 is etched with a chlorine-containing plasma which attacks these areas of the aluminum which are exposed through the channels 16 in the photoresist layer 14. After plasma etching, the layered substrate is usually water quenched and etched in a liquid etchant, such as a mixture of phosphoric, nitric and acetic acids, prior to removing the photoresist. Thereafter, the photoresist is removed by conventional chemical treatment, and the resulting structure is as illustrated in FIG. 1E. Up until this step, the processing described has been conventional and the techniques are well known in the art.

Before depositing the copper layer onto the aluminum layer 10, it is necessary to sputter etch the overlaying aluminum oxide. Typically, removal of the top 20 to 30 Angstroms is sufficient. After the oxide removal, the copper layer is deposited to a thickness of about 200 to 600 Angstroms (depending on the thickness of aluminum and percentage of copper desired) by sputtering, evaporation, or other conventional techniques. It is critical that the aluminum oxide not be allowed to reform prior to the deposition of copper. It has been found that the presence of aluminum oxide substantially inhibits the migration of copper into the aluminum, preventing the desired distribution pattern therein. Aluminum oxide formation may be prevented by maintaining the device in a low oxygen environment, after the aluminum oxide has been removed and until the copper layer has been deposited. Conveniently, the removal of the aluminum oxide can be performed in the same chamber as the copper deposition with a vacuum being continuously maintained in the chamber.

Figure 1H:
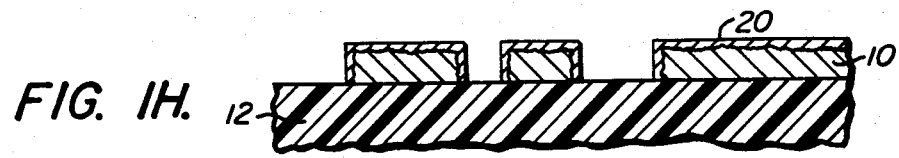

After the copper has been deposited, a thin copper layer 18 (FIG. 1F) covers the entire surface of the wafer, including the exposed substrate 12 and aluminum 10. The copper 18 is then diffused into the aluminum layer 10 by heating to a temperature of from about 250° to 500° C., more usually 300° to 450° C., for about 1 to 2 minutes. This heating step allows the copper to diffuse into the surface layer of the aluminum, illustrated at reference numeral 20 in FIG. 1G. The excess copper from the field areas 22 is then removed by exposure to nitric acid for about 30 seconds, leaving the final structure as illustrated in FIG. 1H.

The second exemplary method for introducing copper to aluminum interconnect lines by the method of the present invention is illustrated in FIGS. 2A-2I. Where applicable, identical reference numerals are used to identify the same items.

The first step in the process again comprises forming an aluminum layer 10 over a wafer substrate 12 according to conventional techniques. As before, the aluminum will typically be an aluminum-silicon alloy of a type well known in the art. From this point on, however, the specific methods differ.

The copper layer 18 will be deposited on the aluminum layer 10 prior to forming the interconnects. The aluminum layer 10 is first sputter etched to remove the aluminum oxide layer. Thereafter, the copper layer 18 is deposited, usually to a thickness of about 400 to 600 Angstroms, by sputtering, evaporation, or other techniques. Finally, the copper layer 18 is diffused into the aluminum layer 10, resulting in a high concentration of copper at the upper surface of the aluminum, as illustrated at 20 in FIG. 2C. As with the previous method, it will be necessary to prevent the reformation of aluminum oxide between the sputter etching and deposition of copper. Conveniently, this will be accomplished by maintaining the wafer continuously under a vacuum as the oxide removal, copper deposition and diffusion steps are performed.

Figure 2A:
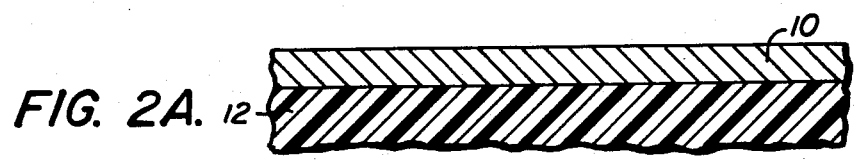
FIGS. 2A-2I illustrate the process steps in the second embodiment of the invention.
Figure 2B:
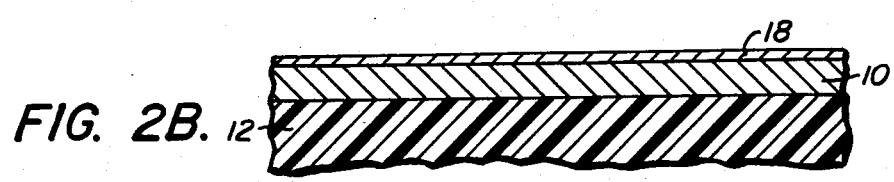
Figure 2C:
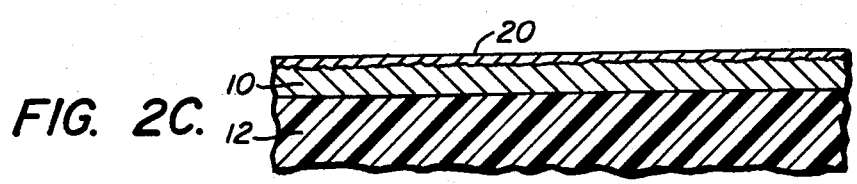
Figure 2D:
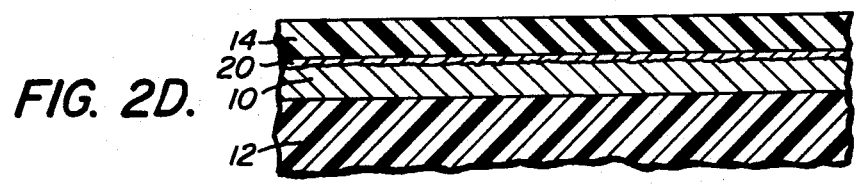

After the copper has been introduced to the aluminum layer 10, a layer of photoresist 14 is deposited on top of the aluminum-copper layer 10, 20, as illustrated in FIG. 2D. The photoresist 14 is patterned by conventional techniques, resulting in the structure illustrated in FIG. 2E.

Figure 2E:
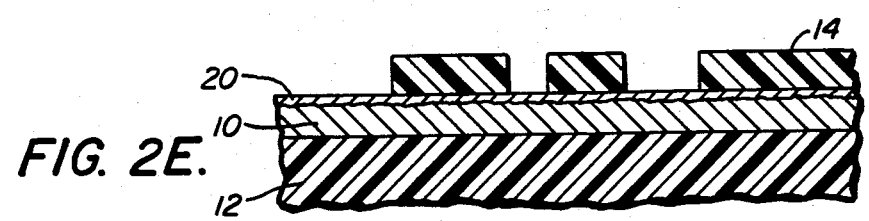
Figure 2F:
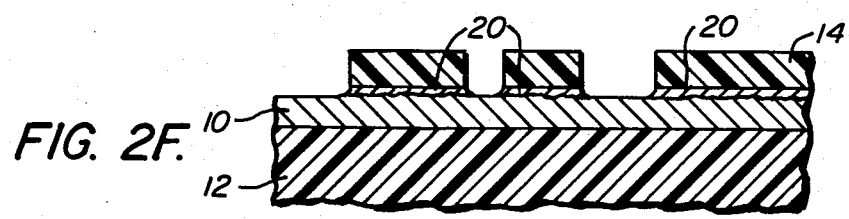

The structure of FIG. 2E suffers from the previously described problems found in the prior art. In fact, the aluminum copper layer 10, 20 would be highly resistant to chlorine plasma etching since the copper is concentrated in the upper layer which would first be exposed to the plasma. However, it has been found that such a copper-rich aluminum layer 20 can be removed using a liquid etchant, typically a solution containing phosphoric and nitric acids or hydrochloric acid in water. In this manner, the copper rich layer is removed, typically to a depth of from about 1000 to 1500 Angstroms, resulting in the structure shown in FIG. 2F.

Figure 2G:
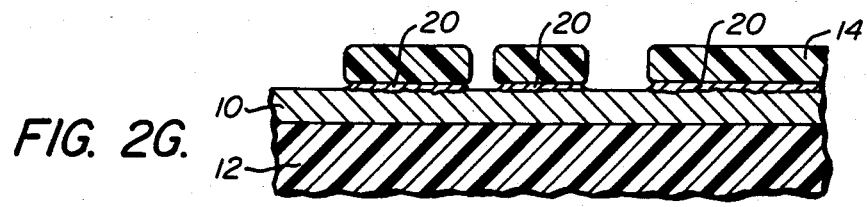
Figure 2H:
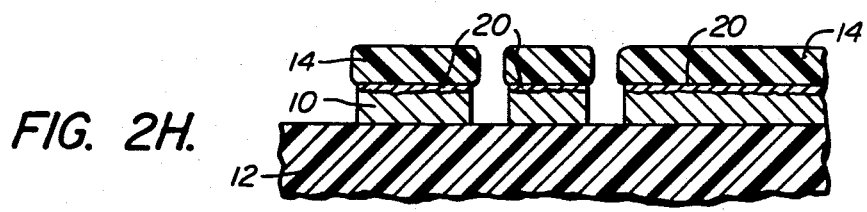

Prior to plasma etching, it is desirable to cover the exposed edges of the copper-rich layer 20 to prevent copper chloride formation. Conveniently, this is accomplished by heating the photoresist to a temperature of about 160° C. so that it flows downward to cover the edges, as illustrated in FIG. 2G.

Figure 2I:
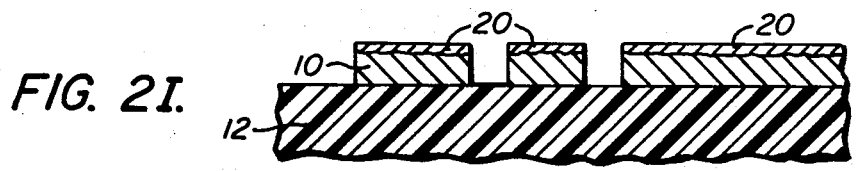

At this point, the aluminum layer 10 can be etched with chlorine-containing plasma to form the desired interconnect pattern. After etching, the wafer usually is water quenched or quenched in a basic solution of NH$_4$OH and dipped in a liquid etchant to remove residual photoresist. After removing the remaining photoresist layer 14, the structure shown in FIG. 2I is achieved.

Although the foregoing description has been directed at the use of chlorine plasma etching of the aluminum interconnects, the present invention will also find use with various wet etching processes where the localization of a copper-rich layer near the surface of the aluminum inhibits dislocation of the aluminum during subsequent processing steps. The process for forming the copper-rich layer will be identical to process intended for plasma etching. The only difference will be that a conventional wet etching process will be employed for defining the interconnect lines rather than the plasma etching described above.

According to the present invention, novel semiconductor constructions are provided which display superior electromigration resistance and facilitate plasma etching of aluminum interconnects. By providing a copper-rich layer on the surfaces of the aluminum interconnects, superior electromigration resistance is achieved. Moreover, the remaining portion of the aluminum layer remains substantially free from copper, facilitating chlorine plasma etching.

Although the foregoing invention has been described in some detail by way of illustration and example for purposes of clarity of understanding, it will be obvious that certain changes and modifications may be practiced within the scope of the appended claims.

What is claimed is:

1. A method for forming aluminum-copper interconnects on a semiconductor device, said method comprising:
    (a) layering aluminum substantially free from copper onto the device;
    (b) etching a predetermined interconnect pattern in the resulting aluminum layer prior to layering copper on the device;
    (c) removing aluminum oxide from the surface of the aluminum;
    (d) layering copper onto the resulting aluminum interconnect lines, wherein at least steps (c) and (d) are performed substantially in a vacuum; and
    (e) diffusing the layered copper into the aluminum by exposing the device to an elevated temperature.

2. A method as in claim 1, wherein the elevated temperature is about 250° to 500° C.

3. A method as in claim 1, wherein the copper is layered onto the device by sputtering.

4. A method as in claim 1, wherein the aluminum layer is an aluminum-silicon alloy.

5. A method as in claim 1, wherein the etching is performed using a chlorine-containing plasma.

6. A method as in claim 1, wherein the etching is performed by a wet etching process.

* * * * *